US010025106B2

(12) United States Patent
Mitra (10) Patent No.: US 10,025,106 B2
(45) Date of Patent: Jul. 17, 2018

(54) LASER-DIODE BAR LIGHTING DEVICE (71) Applicant: LIMO Patentverwaltung GmbH & Co. KG, Dortmund (DE)

(72) Inventor: Thomas Mitra, Dortmund (DE)

(73) Assignee: LIMO PATENTVERWALTUNG GMBH & CO. KG, Dortmund (DE)

( * ) Notice: Subject to any disclaimer, the term of this patent is extended or adjusted under 35 U.S.C. 154(b) by 0 days.

(21) Appl. No.: 14/775,504

(22) PCT Filed: Mar. 14, 2014

(86) PCT No.: PCT/EP2014/055115
§ 371 (c)(1),
(2) Date: Sep. 11, 2015

(87) PCT Pub. No.: WO2014/140285
PCT Pub. Date: Sep. 18, 2014

(65) Prior Publication Data
US 2016/0025987 A1 Jan. 28, 2016

(30) Foreign Application Priority Data
Mar. 14, 2013 (DE) .................. 10 2013 102 599

(51) Int. Cl.
*G02B 27/09* (2006.01)
*G02B 19/00* (2006.01)
(Continued)

(52) U.S. Cl.
CPC ....... *G02B 27/0927* (2013.01); *G02B 3/0043* (2013.01); *G02B 5/045* (2013.01);
(Continued)

(58) Field of Classification Search
CPC ..... G02B 27/0972; G02B 27/30; G02B 27/43
(Continued)

(56) References Cited

U.S. PATENT DOCUMENTS 5,796,521 A 8/1998 Kahlert
5,867,324 A * 2/1999 Kmetec ............... G02B 27/09
359/625

(Continued)

FOREIGN PATENT DOCUMENTS

CN 101878444 A1 11/2010
DE 10209605 A1 10/2002
(Continued)

OTHER PUBLICATIONS

Peter Schreiber, Bernd Hoefer, Peter Dannber, Uwe D., Zeitner, "High brightnss fiber-coupling schemes for diode laser bars", Proc. SPIE 5876, Laser Beam Shaping VI, Jul. 31, 2005 , pp. 587602-1-587602-9.
(Continued)

*Primary Examiner* — Brandi Thomas
*Assistant Examiner* — Travis Fissel
(74) *Attorney, Agent, or Firm* — Cohen & Hildebrand, PLLC (57) ABSTRACT

A lighting device (1) including at least one laser-diode bar with a plurality of emitters arranged adjacently to one another in a first direction and able to emit sub-beams during operation. The sub-beams having a lower beam divergence in a first direction that forms a slow-axis direction than in a second direction that forms a fast-axis direction and is perpendicular to the first direction. At least some of the emitters having a height offset in relation to the other emitters. A fast collimation means positioned behind the at least one laser-diode bar in a beam-propagation direction perpendicular to the slow-axis direction and the fast-axis direction. Beam transformation means positioned behind the fast-axis collimation means in the beam-propagation direction and designed to rotate the sub-beams through 90° as they pass thorough said means. A prism array positioned (Continued)

behind the beam transformation means in the beam-propagation direction and a number of prism means corresponding to the number of emitters and arranged adjacently to one another in the first direction, each of which has an incident light face and a light output face for one of the sub-beams. The incident light faces and/or the light output faces of the prism means, through which the sub-beams with a height offset pass, are designed such that the Poynting effect can be corrected by the parallelization of said sub-beams.

7 Claims, 3 Drawing Sheets (51) Int. Cl.
  *G02B 3/00* (2006.01)
  *G02B 5/04* (2006.01)
  *H01S 5/00* (2006.01)
  *G02B 27/30* (2006.01)
  *H01S 5/40* (2006.01)

(52) U.S. Cl.
  CPC ..... *G02B 19/0014* (2013.01); *G02B 19/0057* (2013.01); *G02B 19/0066* (2013.01); *G02B 27/0972* (2013.01); *G02B 27/30* (2013.01); *H01S 5/005* (2013.01); *H01S 5/4025* (2013.01); *H01S 5/4031* (2013.01)

(58) Field of Classification Search
  USPC .................. 359/641; 372/43.01; 385/33–36
  See application file for complete search history.

(56) References Cited

U.S. PATENT DOCUMENTS

| | | | |
|---|---|---|---|
| 5,995,289 A | 11/1999 | Hwu et al. | |
| 6,044,096 A | 3/2000 | Wolak et al. | |
| 6,166,759 A | 12/2000 | Blanding | |
| 6,324,190 B1 | 11/2001 | Du et al. | |
| 6,471,372 B1 | 10/2002 | Lissotschenko | |
| 6,680,800 B1 | 1/2004 | Schreiber et al. | |
| 7,843,480 B2* | 11/2010 | Albrecht | B41C 1/00 347/234 |
| 7,970,040 B1* | 6/2011 | Sprangle | H01S 3/067 372/98 |
| 2002/0025096 A1* | 2/2002 | Wang | G02B 27/09 385/8 |
| 2004/0090519 A1 | 5/2004 | Mikhailov | |
| 2005/0063435 A1 | 3/2005 | Imai | |
| 2006/0159147 A1 | 7/2006 | Grenier | |
| 2006/0291509 A1 | 12/2006 | Mitra | |
| 2008/0137707 A1 | 6/2008 | Mikliaev et al. | |
| 2011/0110626 A1* | 5/2011 | Aschke | H01S 5/4012 385/33 |
| 2012/0134175 A1* | 5/2012 | Kunimasa | G02B 6/0016 362/602 |

FOREIGN PATENT DOCUMENTS

| | | |
|---|---|---|
| DE | 102007020789 A1 | 11/2008 |
| EP | 1 006 382 | 6/2000 |
| JP | 2000-137139 A | 5/2000 |
| JP | 2004096092 A | 3/2004 |
| JP | 2004525418 A | 8/2004 |
| JP | 20060050 A | 1/2006 |
| JP | 2009503596 A | 1/2009 |
| WO | 2005010592 A1 | 2/2005 |
| WO | 2011091170 A2 | 7/2011 |
| WO | WO2011091170 A2 * | 7/2011 ............ G02B 6/262 |
| WO | 2011109760 A1 | 9/2011 |

OTHER PUBLICATIONS

International Search Report of PCT/EP2014/055115, dated May 26, 2014.
German Search Report of DE 10 2013 1132 599.4, prepared Nov. 27, 2913.

* cited by examiner

LASER-DIODE BAR LIGHTING DEVICE

This is an application filed under 35 USC § 371 of PCT/EP2014/055115 filed on Mar. 14, 2014 claiming priority to DE 10 2013 102 599.4 filed on Mar. 14, 2013.

BACKGROUND OF THE INVENTION

The present invention relates to a lighting device.

Definitions

The "propagation direction" is understood to mean the mean propagation direction of the light, particularly if the latter is not a plane wave or is at least partly convergent or divergent. Unless anything else to the contrary is explicitly specified, light beam, sub-beam or beam does not refer to an idealized ray from geometric optics, but rather a real light beam, such as e.g. a laser beam with a Gaussian profile, which does not have an infinitesimally small beam cross section, but rather an extended beam cross section.

Laser diode bars are known as laser light sources from the prior art and have a plurality of semiconductor emitters which are arranged at a distance from one another and next to one another in a first direction—the so-called slow-axis direction (long axis). The slow-axis direction is that direction in which the active layer of the semiconductor diode extends, whereas the so-called fast-axis direction (short axis) is the direction perpendicular thereto. The sub-beams emitted by the individual emitters of the laser diode bar have a substantially larger divergence in the fast-axis direction than in the slow-axis direction. As a consequence, the sub-beams broaden more quickly along the short axis than along the long axis.

In the prior art, fiber-coupled lighting devices with at least one laser diode bar in particular are constructed in such a way that the beam parameter product of this laser diode bar is symmetrised by an optical bears transformation means, as is disclosed in e.g. EP 1 006 382 A1. Such an optical beam transformation means has a light-entry side, through which the laser light may enter, with a number of cylindrical lens segments arranged parallel to one another and a light-exit side with a number of cylindrical lens segments arranged parallel to one another. The axes of the cylindrical lens segments on the light-entry side and on the light-exit side include an angle of 45° with a base side of the beam transformation means, which extends in the first direction (x-direction). When a laser beam incident on the beam transformation means in a line-shaped manner, as can be produced by the laser diode bar, passes therethrough, the sub-beams experience a common beam rotation through 90° when passing through the beam transformation means.

A relatively large distance must be maintained between the individual sub-beams, which emerge from the beam transformation means, for geometric reasons. This necessary distance is very detrimental to the beam parameter product along the long axis downstream of the beam transformation means in relation to the theoretically possible value, which beam parameter product is a physical characteristic by means of which the beam quality and hence also the focusability of a laser beam can be described. By way of example, a possible approach for improving the beam parameter product consists of arranging a beam expansion means, in particular a telescope array with a plurality of telescope means, downstream of the beam transformation means. By means of this, it is at least theoretically possible to achieve a reduction in the divergence of the individual sub-beams. Furthermore, the individual beam widths can be enlarged and the gaps, which are theoretically unnecessary, between adjacent sub-beams can be closed. However, in a practical application, such an approach fails due to the so-called "smile" distortion of the emitters of the laser diode bar. The cause of this "smile" distortion lies in manufacturing-caused bending of the laser diode bar, which leads to the sub-beams not propagating parallel to one another downstream of the beam transformation means. In the real design of the lighting device with a fast-axis collimation means and a beam transformation means, the effect of the "smile" distortion is such that some of the emitters of the laser diode bar do not emit level with the optical axis. Here, the optical axis for each one of the emitters is defined by the vertex of the fast-axis collimation means preferably embodied as a cylindrical lens means. Although the sub-beams of those emitters of the laser diode bar which impinge on the fast-axis collimation means at the "wrong" height are collimated well, the Poynting vector of the collimated sub-beams of these emitters has an error in relation to the remaining emitters lying at the "right" height. This Poynting error can be estimated as follows: height error [µm]/focal length of the fast-axis collimation means [mm]=Poynting error [mrad].

The Poynting error is likewise rotated after rotating the sub-beams by means of the beam transformation means. Consequently, the envelope of the angle distribution of all emitters of the laser diode bar is correspondingly enlarged (broadened).

BRIEF SUMMARY OF THE INVENTION

The present invention is based on the object of providing a lighting device which enables an effective compensation of the "smile" distortion in order thereby to bring the beam parameter product as close as possible to the theoretically possible limit.

A lighting device according to the invention is distinguished by the fact that the lighting device comprises a prism array arranged downstream of the beam transformation means in the beam propagation direction and comprising a number of prism means corresponding to the number of emitters, which prism means are arranged next to one another in the first direction and each have a light-entry face and a light-exit face for one of the sub-beams, wherein the light-entry faces and/or the light-exit faces of those prism means, through which those sub-beams which have a height offset pass, are embodied in such a way that the Poynting error can be compensated for by parallelising these sub-beams. In other words, the prism array is configured in such a way that the Poynting error in the beam propagation direction downstream of the beam transformation means can be corrected for each emitter by means of a prism means shaped in a suitable manner. Hence, an effective compensation of the "smile" distortion is achieved, and so the beam parameter product can be brought as close as possible to the theoretically possible limit.

A particularly efficient compensation of the "smile" distortion can be achieved by virtue of the light-exit faces of those prism means, through which those sub-beams which have a height offset pass, having a wedge-shaped embodiment in the first direction. The light-entry faces of these prism means preferably have a planar embodiment.

In order to fill the gaps between the collimated sub-beams and effectively reduce the divergence alter the compensation of the "smile" distortion has taken place by means of the prism array, a particularly advantageous embodiment proposes that at least one beam expansion means is arranged downstream of the prism array in the beam propagation direction. In a particularly advantageous embodiment, the beam expansion means can comprise a telescope array with a plurality of telescope means, which are arranged next to one another in the first direction. Here, exactly one telescope means is preferably associated with each one of the emitters or with each one of the sub-beams.

An alternative way of achieving the object of the present invention provides for the light-entry faces and/or the light-exit faces of those telescope means, through which those sub-beams which have a height offset pass, to be embodied in such a way that the Poynting error can be compensated for by parallelizing these sub-beams. In contrast to the previously described solution, the lighting device comprises a telescope array for expanding the sub-beams and for reducing the beam divergence, wherein some or the telescope means have a specific embodiment to compensate for the Poynting error. This likewise brings about an effective compensation of the "smile" distortion such that the beam parameter product can be brought as close as possible to the theoretically possible limit.

In a preferred embodiment, provision can be made for the light-entry faces and/or the light-exit faces of those telescope means, through which those sub-beams which have a height offset pass, to have an asymmetric shape in relation to the optical axis of the sub-beams associated therewith.

In an alternative preferred embodiment, it is also possible for the telescope means, through which those sub-beams which have a height offset pass, to have a lateral offset in relation to the optical axis.

What is proposed in a particularly advantageous embodiment is that the light-entry faces of the telescope means have a concave shape and that the light-exit faces of the telescope means have a convex shape. As a result of this, an efficient expansion of the sub-beams can be achieved.

A further alternative way of achieving the object of the present invention provides for the cylindrical lens segments on the light-entry side and/or on the light-exit side, through which cylindrical lens segments those sub-beams which have a height offset pass, to be embodied in such a way that the Poynting error can be compensated for by parallelizing these sub-beams. This likewise achieves an effective compensation of the "smile" distortion such that the beam parameter product can be brought as close as possible to the theoretically possible limit. The "smile" compensation which can be achieved by this third variant of the present invention acts along both axes, i.e. along the slow-axis direction and along the fast-axis direction, unlike in the first and second variants. However, the Poynting error, which then is added to the not yet collimated axis, is very small compared to the divergence of this axis. The beam diameter is only slightly larger after a slow-axis collimation using a slow-axis collimation means than therebefore.

What is proposed in a preferred embodiment is that the light-entry faces and/or the light-exit faces of those telescope means, through which those sub-beams which have a height offset pass, have an asymmetric shape in relation to the optical axis of the sub-beams associated therewith.

In an alternative embodiment, it is possible for those cylindrical lens segments on the light-entry side and/or the light-exit side, which are associated with those sub-beams which have a height offset, to have a symmetric shape and to be laterally offset in relation to the optical axis of the sub-beams associated therewith.

The basic concept of the present invention is directed to a reduction in the beam divergence of the laser radiation emitted by the emitters of at least one laser diode bar, which laser radiation may e.g. be provided for a fiber coupling. The lighting devices according to the invention are able to once again correct the Poynting error of individual emitters such that the envelope of the angle distributions corresponds to the angle distribution of an emitter.

After compensating for the "smile" distortion, a cylindrical lens can collimate the divergence of the slow-axis in all embodiments of the lighting device presented here. The laser beam collimated and symmetrised thus can be coupled into an optical fiber by means of two cylindrical lenses or a lens with a spherical or aspherical embodiment.

BRIEF DESCRIPTION OF THE DRAWINGS

Further features and advantages of the present invention will be elucidated on the basis of the subsequent description of preferred exemplary embodiments, with reference being made to the attached figures. Here.

DETAILED DESCRIPTION OF THE INVENTION

Figure 1:
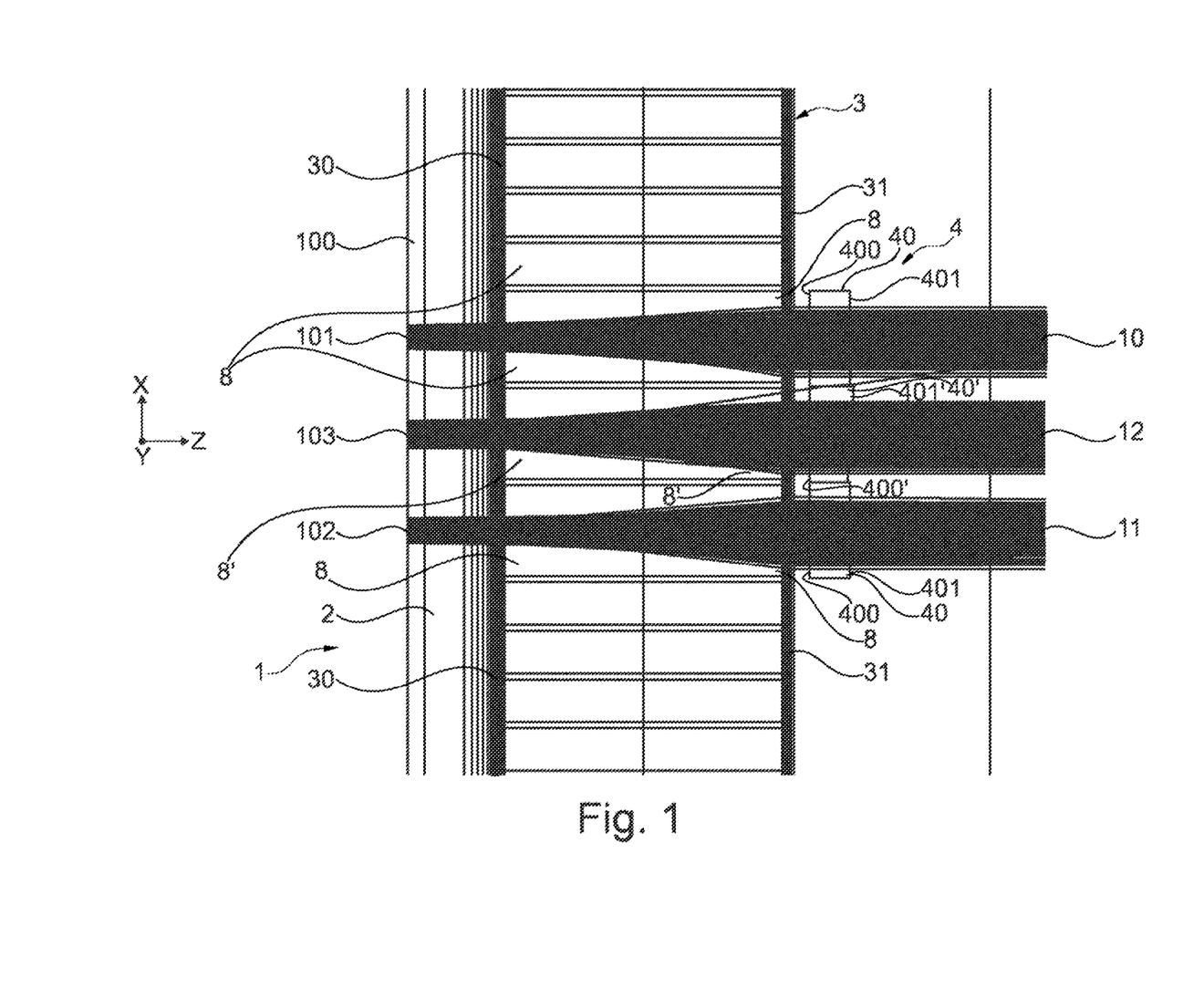
FIG. 1 shows a schematically very simplified side view of a lighting device which is embodied in accordance with a first exemplary embodiment of the present invention.

With reference to FIG. 1, a first exemplary embodiment of a lighting device 1 is intended to be explained in more detail below. In order to simplify the subsequent description, a Cartesian coordinate system was inserted into FIG. 1, with the z-direction being the propagation direction of the laser light.

The lighting device 1 comprises a laser light source comprising a laser diode bar 100. The laser diode bar 100 has a plurality of emitters 101, 102, 103, which are spaced apart and arranged next to one another in a first direction (x-direction). The laser beams emitted by the individual emitters 101, 102, 103 of the laser diode bar 100—referred to as sub-beams 10, 11, 12 below—have a significantly smaller divergence along a long axis corresponding to the x-direction than along a second, short axis corresponding to the y-direction. It is generally conventional to denote the direction of larger divergence (short axis) as "fast-axis direction" and the direction of smaller divergence (long axis) as "slow-axis direction". It is known that a so-called "smile" distortion may occur in the case of laser diode bars 100 of the aforementioned type, in which a plurality of emitters 101, 102, 103 are arranged next to one another in a row. This "smile" distortion is caused primarily by bending of the laser diode bar 100 during the production thereof.

Arranged downstream of the laser diode bar 100 in the beam propagation direction (z-direction) there is a fast-axis colligation means 2, which is preferably embodied as a plano-convex cylindrical lens with a large numerical aperture, with the cylinder axis extending in the first direction (x-direction), in which the emitters 101, 102, 103 of the laser diode bar 100 are arranged next to one another. In particular, this cylindrical lens can have a very small focal length and preferably be arranged very close to the emitters 101, 102, 103 of the laser diode bar 100.

Arranged downstream of the fast-axis collimation means 2 in the beam propagation direction there is an optical beam transformation means 3, which is embodied in such a way that the sub-beams 10, 11, 12, which are emitted by the emitters 101, 102, 103, arranged next to one another in the x-direction, of the laser diode bar 100, can be rotated together by 90°. The basic design of the beam transformation means 3 is known from e.g. EP 1 006 382 A1, and so the basic functional principle of the beam transformation means 3 will only be discussed briefly below. The beam transformation means 3 is made from a transparent material and comprises optically functional interfaces on both a light-entry side 30 and a light-exit side 31, which functional interfaces respectively have a plurality of cylindrical lens segments 8, 8', the cylinder axes of which are oriented substantially parallel to one another. The cylinder axes of all cylindrical lens segments 8, 8' include an angle of 45° with a base side, extending in the x-direction, of the optical beam transformation means 3. Here, a plurality of cylindrical lens segments 8, 8' are embodied next to one another on each one of the two xy-faces of the beam transformation means 3. When passing through the optical beam transformation means 3, the sub-beams 10, 11, 12 experience a common rotation about 90°. The "smile" distortion expresses itself in such a way that some of the emitters 101, 102, 103 of the laser diode bar 100 do not emit level with the optical axis. Here, the optical axis for each one of the emitters 101, 102, 103 is defined by the vertex of the fast-axis collimation means 2 embodied as cylindrical, lens means. Although the emitters 101, 102, 103 of the laser diode bar 100 whose sub-beams 10, 11, 12 impinge on the fast-axis collimation means 2 at the "wrong" height are collimated well, the Poynting vector of the collimated sub-beams 10, 11, 12 of these emitters 101, 102, 103 has an error in relation to the remaining emitters 101, 102, 103 lying at the "right" height. This Poynting error can be estimated as follows: height error [μm]/focal length of the fast-axis collimation means 2 [mm] =Poynting error [mrad]. The Poynting error is likewise rotated after the rotation of the sub-beams 10, 11, 12 by the beam transformation means 3. As a consequence, the envelope of the angle distribution of all emitters 101, 102, 103 of the laser diode bar 100 is correspondingly enlarged (broadened).

In order to achieve a compensation of the "smile" distortion, the lighting device 1 in this exemplary embodiment comprises a prism array 4 with a number of prism means 40, 40' arranged next to one another in the first direction (x-direction), which prism means each comprise a light-entry face 400, 400' and a light-exit face 401, 401'. The prism array A is arranged, downstream of the optical beam transformation means 3 in the beam propagation direction (z-direction). Each one of the sub-beams 10, 11, 12 passes through respectively one of the prism means 40, 40', and so exactly one prism means 40, 40' of the prism array 4 is associated with each one of the sub-beams 10, 11, 12.

For simplifying the illustration, merely three sub-beams 10, 11, 12 are plotted in FIG. 1 and also in the remaining figures. In the present case, the assumption should be made that the central sub-beam 12 has an offset of 3 μm in the y-direction in relation to the two remaining sub-beams 10, 11 due to the "smile" distortion of the emitters 101, 102, 103 of the laser diode bar 100. The two remaining emitters 101, 102 are situated level with the vertex of the fast-axis collimation means 2. In order to compensate this offset, the prism means 40' associated, with this sub-beam 12 has the shape of a wedge. This means that this prism means 40' has a slightly inclined light-exit face 400', when observed in the first direction (x-direction), for parallelizing the sub-beam 12. The prism means 40 which are associated with those sub-beams 10, 11 whose emitters 101, 102 have no offset have mutually parallel light-entry faces 400 and light-exit faces 401 and therefore do not have the shape of a wedge.

The Poynting error downstream of the optical beam transformation means 3 can be corrected very generally by the prism array 4 for each emitter 101, 102, 103 by correspondingly matched wedge-shapes of the prism means 40, 40', with, preferably, the corresponding inclinations only being provided in the region of the light-exit faces 401, 401'.

In order to fill the gaps between the collimated sub-beams 10, 11, 12 in an advantageous manner and in order to reduce the beam divergence, a beam expansion means (not depicted explicitly here) may be arranged downstream of the prism array 4 in the beam, propagation direction. In particular, the beam expansion means can be a telescope array with a plurality of telescope means arranged next to one another in the x-direction, which telescope means can expand the sub-beams 10, 11, 12. The telescope means can preferably be embodied as a Galilean telescope means with a concavely shaped light-entry side and a convexly shaped light-exit side.

The lighting device 1 enables an effective compensation of the "smile" distortion such that the beam parameter product can be brought very close to the theoretically possible limit.

A second exemplary embodiment of a lighting device 1 is intended to be explained in more detail below with reference to FIG. 2. The lighting device 1 once again comprises a laser diode bar 100 with a plurality of emitters 101, 102, 103, which are arranged next to one another in the first direction (x-direction), a fast-axis colligation means 2, which is configured in the manner described above with reference to FIG. 1 as a plano-convex cylindrical lens with a cylinder axis extending in the first direction (x-direction), and a beam transformation means 3, which is embodied in such a way that it can rotate the sub-beams 10, 11, 12 together about 90° in the manner described above.

In order to compensate the "smile" distortion, the lighting device 1 in this exemplary embodiment comprises a specially embodied telescope array 5 with a plurality of telescope means 50, 50', which are arranged next to one another in the first direction (x-direction) and which can expand the sub-beams 10, 11, 12 after these pass therethrough. The number of telescope means 50, 50' corresponds to the number of emitters 101, 102, 103 of the laser diode bar 100, and so exactly one telescope means 50, 50' is associated with every single one of the sub-beams 10, 11, 12. Each one of the telescope means 50, 50' respectively comprises a concavely shaped light-entry face 510, 510' for one of the sub-beams 10, 11, 12 and a light-exit face 511, 511' which has a convex form. In the present case, the compensation of the "smile" distortion is integrated into the telescope array 5 as a function. This is achieved by virtue of at least some of the telescope means 50, 50' having an asymmetric form in relation to the optical axis of the sub-beams 10, 11, 12 associated therewith or having a lateral offset from said optical axis. In this context, an asymmetric form of the light-entry faces 510, 510' of the telescope means 50, 50' is particularly advantageous because this can prevent sub-beams 10, 11, 12 which have entered one of the telescope means 50, 50' from emerging from the light-exit face 511, 511' of another (in particular of an adjacent) telescope means 50, 50' because of the "smile distortion".

Figure 2:
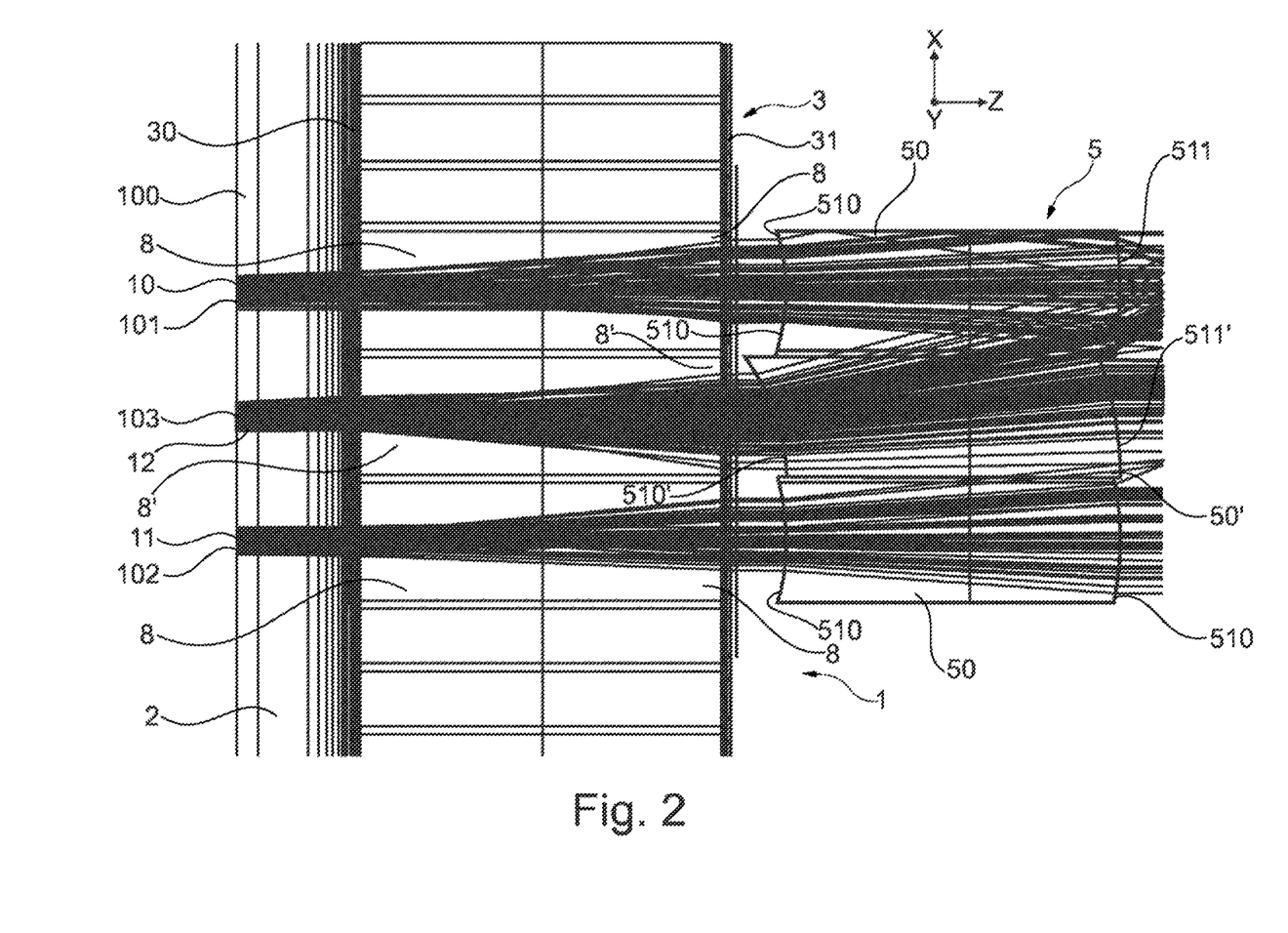
FIG. 2 shows a schematically very simplified side view of a lighting device which is embodied in accordance with a second exemplary embodiment of the present invention.

In FIG. 2, the two emitters 101, 102 of the laser diode bar 100, which emit the first sub-beam 10 and the second sub-beam 11, are once again situated level with the vertex of the fast-axis collimation means 2 embodied as a cylindrical lens. The emitter 103, arranged between these two emitters 101, 102, of the laser diode bar 100, which emitter emits the third sub-beam 12 which passes through the telescope means 50' associated therewith, has a height offset (in this case: 3 μm) in relation to the other two emitters 101, 102. What becomes clear from FIG. 2 is that the telescope means 50, through which the first sub-beam 10 and the second sub-beam 11 pass, have a symmetric embodiment in relation to the optical axis of the relevant sub-beam 10, 11. The telescope means 50' associated with the third laser beam bundle 12 has such a shape on the concave light-entry face 510' and the convex light-exit face 511' thereof that there is asymmetry in relation to the optical axis of the third laser beam bundle 12 in these regions and said laser beam bundle can be parallelized after its passage therethrough. These asymmetries can be obtained in a particular simple manner by virtue of the telescope means 50', which is otherwise symmetric in relation to the optical axis of the third laser beam bundle 12, being cut in an off-centered manner on the light-entry face 510' and on the light-exit face 511' in order to obtain the form shown in FIG. 2. In principle, it is possible for the light-entry face 510' and the light-exit face 511' to have an embodiment with a different degree of off-centering or an asymmetry in relation to the optical axis.

This lighting device 1 also enables an effective compensation of the "smile" distortion by parallelizing those sub-beams 12, the emitters 103 of which have a height offset, such that the beam parameter product can be brought very close to the theoretically possible limit.

A third exemplary embodiment of a lighting device 1 is intended to be explained in more detail below with reference to FIG. 3. The lighting device 1 once again comprises a laser diode bar (not depicted explicitly here) with a plurality of emitters, which are arranged next to one another in the x-direction, a fast-axis collimation means 2, which is configured in the manner described above with reference to FIG. 1 as a plano-convex cylindrical lens with a cylinder axis in the first direction (x-direction), and a beam transformation means 3, which can rotate the sub-beams 10, 11, 12 about 90° in the manner described above. In the third exemplary embodiment, presented, here, the optical, beam transformation means 3 has specially formed cylindrical lens segments 3, 8' on both the light-entry side 30 and the light-exit side 31 in order to compensate the "smile" distortion by parallelizing the sub-beams 10, 11, 12. In the present case, this is achieved by virtue of some of the cylindrical lens segments 8, 8' of the beam transformation means 3 being formed asymmetrically in relation to the optical axis of the sub-beams 10, 11, 12 associated therewith or having a lateral offset in relation to the optical axis and therefore being off-centered.

Figure 3:
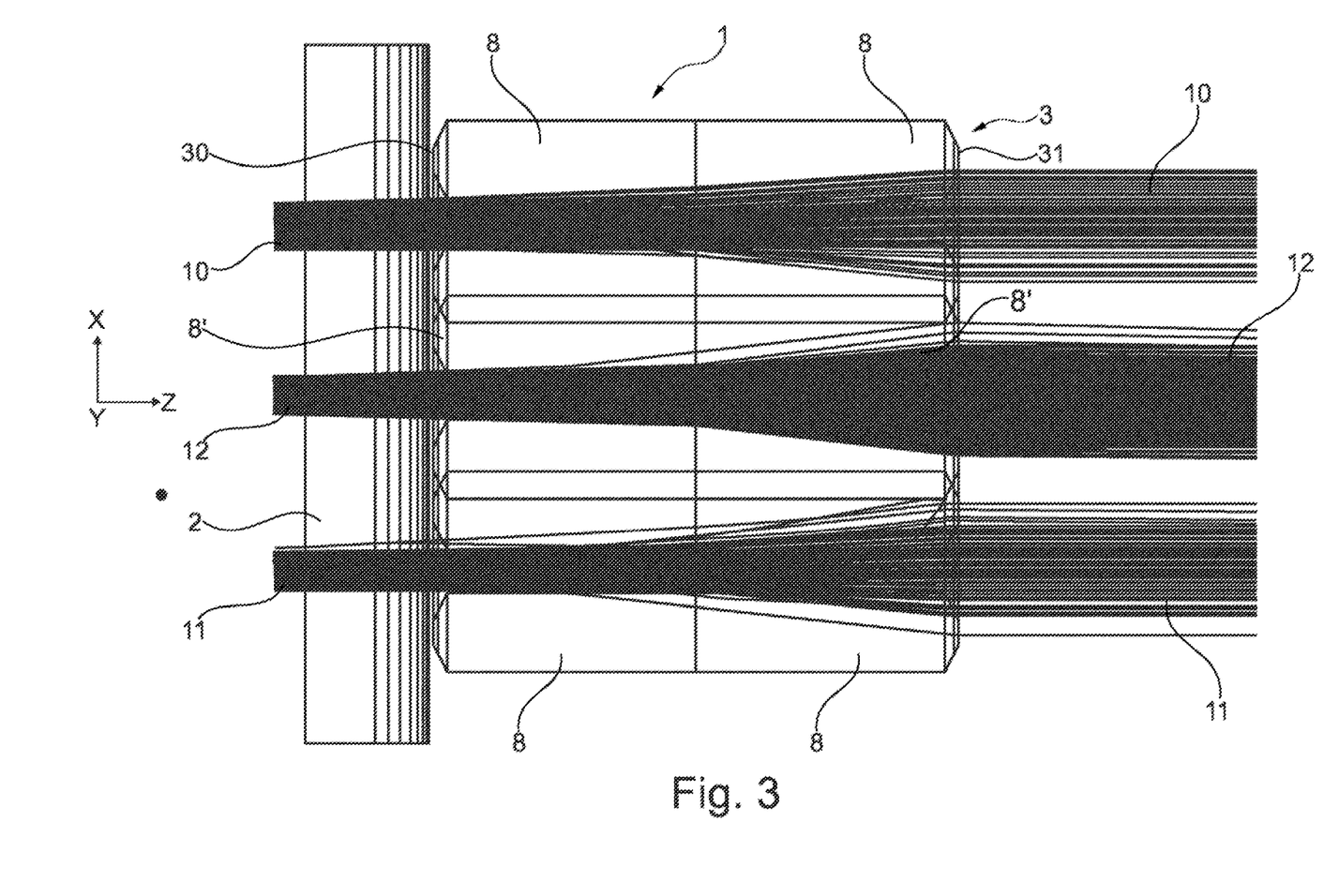
FIG. 3 shows a schematically very simplified side view of a lighting device which is embodied in accordance with a third exemplary embodiment of the present invention.

In FIG. 3, the two emitters of the laser diode bar, which emit the first sub-beam 10 and the second sub-beam 11, are once again situated level with the vertex of the fast-axis collimation means 2 embodied as a cylindrical lens. The emitter, arranged between these two emitters, of the laser diode bar, which emitter emits the third sub-beam 12 which passes through the cylindrical lens segments 8' associated therewith, has a height offset (in this case: 3 μm) in relation to the two emitters mentioned above. The cylindrical lens segments 8 through which the first sub-beam 10 and the second sub-beam 11 pass have a symmetrical embodiment in relation to the optical axis. At least one of the cylindrical lens segments 8' associated with the third sub-beam 12 is formed on the light-entry side 30 or the light-exit side 31 in such a way that it has an asymmetry in relation to the optical axis of the third sub-beam 12. It is also possible for the two cylindrical lens segments 8' associated with the third sub-beam 12 to be formed on the light-entry side 30 and the light-exit side 31 in such a way that these have an asymmetry in relation to the optical axis of the third sub-beam 12. Alternatively, it is also possible for the cylindrical lens segments 8' associated with the third sub-beam 12 to have a symmetric form on the light-entry side 30 and/or on the light-exit side 31 but have a lateral, offset in relation to the optical axis of the sub-beam 12.

The "smile" compensation that can foe achieved by the third exemplary embodiment of the lighting device 1 acts in both axes, i.e. in the slow-axis direction and in the fast-axis direction, unlike in the first and second exemplary embodiment. However, the Poynting error, which then is added to the not yet collimated axis, is very small compared to the divergence of this axis. The beam diameter is only slightly larger after a slow-axis colligation using a slow-axis collimation means than therebefore.

After the compensation of the "smile" distortion, a cylindrical, lens can collimate the divergence of the slow axis in all exemplary embodiments. The laser beam thus collimated and symmetrized can be coupled into a fiber using two cylindrical lenses or a spherically or aspherically embodied lens.

The invention claimed is:

1. A lighting device (1) having an optical axis, comprising:
   one laser diode bar (100) with a plurality of emitters (101, 102, 103) arranged next to one another in a first direction and emit sub-beams (10, 11, 12) during operation; the sub-beams have a smaller beam divergence in the first direction, which forms a slow-axis direction, than in a second direction orthogonal to the first direction, which forms a fast-axis direction,
   a fast-axis collimation arrangement (2) which is arranged downstream of the one laser diode bar (100) in a beam propagation direction orthogonal to the slow-axis direction and to the fast-axis direction; wherein at least one of the emitters (101, 102, 103) has a height offset in the first direction in relation to the other emitters (101, 102, 103), and the at least one of the emitters (101,102,103) does not radiate sub-beams (10,11,12) at a level of the optical axis of the lighting device (1) corresponding to a vertex of the fast-axis collimation arrangement (2),
   beam transformation arrangement (3) which is arranged downstream of the fast-axis collimation arrangement (2) in the beam propagation direction and is configured to rotate the sub-beams (10, 11, 12) by 90° that pass therethrough,
   wherein the lighting device (1) comprises a prism array (4) arranged downstream of the beam transformation arrangement (3) in the beam propagation direction and comprises a number of prisms (40, 40') corresponding to the number of emitters (101, 102, 103); the prisms are arranged next to one another in the first direction and each of the prisms (40, 40') has a light-entry face (400, 400') and a light-exit face (401, 401') for one of the sub-beams (10, 11, 12); wherein at least one of the light-entry faces (400') and the light-exit faces (401') of those prisms (40'), through which those corresponding sub-beams (12) have the height offset prior to the beam rotation by the beam transformation arrangement (3) pass, are embodied in such a way that a Poynting error (mrad)=height error (μm)/focal length (mm) of the fast-axis collimation arrangement (2) is corrected by parallelizing these sub-beams (12) having the height offset prior to the beam rotation by the beam transformation arrangement (3) pass,
wherein the light-exit faces (401') of the prisms (40'), through which those sub-beams (12) which have the height offset prior to the beam rotation by the beam transformation arrangement (3) pass, have a wedge-shaped configuration in the first direction, whereas the prisms (40), through which those sub-beams (10, 11) whose emitters (101, 102) have no height offset have mutually parallel light-entry faces 400 and light-exit faces 401 and therefore do not have the shape of a wedge.

2. The lighting device (1) as claimed in claim 1, further comprising at least one beam expansion arrangement downstream of the prism array (4) in the beam propagation direction.

3. The lighting device (1) as claimed in claim 2, wherein the at least one beam expansion arrangement comprises a telescope array with a plurality of telescope devices arranged next to one another in the first direction.

4. A lighting device (1), comprising:
one laser diode bar (100) with a plurality of emitters (101, 102, 103) arranged next to one another in a first direction and emit sub-beams (10, 11, 12) during operation; the sub-beams have a smaller beam divergence in the first direction, which forms a slow-axis direction, than in a second direction orthogonal to the first direction, which forms a fast-axis direction,
a fast-axis collimation arrangement (2) which is arranged downstream of the one laser diode bar (100) in a beam propagation direction orthogonal to the slow-axis direction and to the fast-axis direction; wherein at least one of the emitters (101, 102, 103) has a height offset in the first direction in relation to the other emitters (101, 102, 103) such that the at least one of the emitters (101, 102, 103) emits the sub-beams (10,11,12) not level with the optical axis of the lighting device (1) corresponding to a vertex of the fast-axis collimation arrangement (2),
a beam transformation arrangement (3), which is arranged downstream of the fast-axis collimation arrangement (2) in the beam propagation direction and configured to rotate the sub-beams (10, 11, 12) by 90° that pass therethrough,
a telescope array (5) arranged downstream of the beam transformation arrangement (3) in the beam propagation direction and comprising a number of telescope devices (50, 50') corresponding to the number of emitters (101, 102, 103), the telescope devices are arranged next to one another in the first direction and each of the telescope devices (50, 50') has a light-entry face (510, 510') and a light-exit face (511, 511') for one of the sub-beams (10, 11, 12); wherein the light-entry faces (510, 510') and the light-exit faces (511, 511') are formed in such a way to expand one of the sub-beams (10, 11, 12) when passing through the telescope device (50, 50') and gaps between adjacent sub-beams (10, 11, 12) are closed,
wherein at least one of the light-entry faces (510') and the light-exit faces (511') of those telescope devices (50'), through which those sub-beams (12) which have the height offset prior to the beam rotation by the beam transformation arrangement (3) pass, are embodied in such a way that a Poynting error (mrad)=height error (μm)/focal length (mm) of the fast-axis collimation arrangement (2) is corrected by parallelizing these sub-beams (12),
wherein at least one of the light-entry faces (510') and the light-exit faces (511') of the telescope devices (50'), through which those sub-beams (12) which have the height offset prior to the beam rotation by the beam transformation arrangement (3) pass, have an asymmetric shape in relation to the optical axis of the sub-beams (12) associated therewith.

5. The lighting device (1) as claimed in claim 4, wherein the telescope devices (50'), through which those sub-beams (12) which have the height offset prior to the beam rotation by the beam transformation arrangement (3) pass, have a lateral offset in relation to the optical axis.

6. The lighting device (1) as claimed in claim 4, wherein the light-entry faces (510, 510') of the telescope devices (50, 50') have a concave shape and the light-exit faces (511, 511') of the telescope devices (50, 50') have a convex shape.

7. A lighting device (1), comprising:
one laser diode bar (100) with a plurality of emitters (101, 102, 103) arranged next to one another in a first direction and emit sub-beams (10, 11, 12) during operation; the sub-beams have a smaller beam divergence in the first direction, which forms a slow-axis direction, than in a second direction orthogonal to the first direction, which forms a fast-axis direction; wherein at least one of the emitters (101, 102, 103) has a height offset in the first direction in relation to the other emitters (101, 102, 103),
a fast-axis collimation arrangement (2) arranged downstream of the one laser diode bar (100) in a beam propagation direction orthogonal to the slow-axis direction and to the fast-axis direction,
a beam transformation arrangement (3) arranged downstream of the fast-axis collimation arrangement (2) in the beam propagation direction and configured to rotate the sub-beams (10, 11, 12) by 90° that pass therethrough; wherein the beam transformation arrangement (3) comprises optically functional interfaces both on a light-entry side (30) and on a light-exit side (31); all the optically functional interfaces both on the light-entry side (3) and on the light-exit side (31) have a number of cylindrical lens segments (8, 8') corresponding to the number of emitters (101, 102, 103); cylinder axes of all the cylindrical lens segments are oriented substantially parallel to one another and include an angle of 45° with a base side of the optical beam transformation arrangement (3), which extends in the first direction; wherein the cylindrical lens segments (8') on at least one of the light-entry side (30) and the light-exit side (31), through which cylindrical lens segments those sub-beams (12) which have the height offset prior to the beam rotation by the beam transformation arrangement (3) pass, are embodied in such a way that a Poynting error (mrad)=height error (μm)/focal length (mm) of the fast-axis collimation arrangement (2) is corrected by parallelizing these sub-beams (11,12),
wherein those cylindrical lens segments (8) on at least one of the light entry side (30) and the light-exit side (31), which are associated with those sub-beams (10, 11) which have no height offset prior to the beam rotation by the beam transformation arrangement (3), have symmetry in relation to an optical axis of the sub-beams (10, 11) associated therewith,
wherein those cylindrical lens segments (8') on at least one of the light-entry side (30) and the light-exit side (31), which are associated with those sub-beams (12) which have the height offset prior to the beam rotation by the beam transformation arrangement (3), have asymmetry in relation to the optical axis of the sub-beams (12) associated therewith.

\* \* \* \* \*